(12) United States Patent
Wang et al.

(10) Patent No.: US 8,686,310 B2
(45) Date of Patent: Apr. 1, 2014

(54) PACKAGED CHIP DETECTION AND CLASSIFICATION DEVICE

(75) Inventors: Bily Wang, Hsin Chu (TW); Kuei-Pao Chen, Hsin Chu (TW); Hsin-Cheng Chen, Jhudong Township, Hsinchu County (TW)

(73) Assignee: Youngtek Electronics Corporation, Hsinchu (TW)

( * ) Notice: Subject to any disclaimer, the term of this patent is extended or adjusted under 35 U.S.C. 154(b) by 287 days.

(21) Appl. No.: 13/170,705

(22) Filed: Jun. 28, 2011

(65) Prior Publication Data

US 2012/0205297 A1 Aug. 16, 2012

(30) Foreign Application Priority Data

Feb. 14, 2011 (TW) .............................. 100104785 A (51) Int. Cl.
*B07C 5/344* (2006.01)

(52) U.S. Cl.
USPC ...................... 209/573; 209/571; 324/759.03

(58) Field of Classification Search
USPC ................ 209/571–574; 324/757.01, 759.03; 198/441; 414/222.01, 935, 936
See application file for complete search history.

(56) References Cited

U.S. PATENT DOCUMENTS

| | | | | |
|---|---|---|---|---|
| 4,020,950 A | * | 5/1977 | Williams | 209/588 |
| 5,568,870 A | * | 10/1996 | Utech | 209/573 |
| 6,100,707 A | * | 8/2000 | Baumann et al. | 324/755.05 |
| 6,194,679 B1 | * | 2/2001 | Garcia et al. | 209/571 |
| 6,227,345 B1 | * | 5/2001 | Miyamoto | 198/392 |
| 6,479,777 B2 | * | 11/2002 | Yamakawa | 209/574 |
| 6,801,032 B2 | * | 10/2004 | Miyamoto | 324/757.01 |
| 6,967,475 B2 | * | 11/2005 | Tsui et al. | 324/757.04 |
| 6,970,008 B2 | * | 11/2005 | Lu | 324/754.03 |
| 7,704,033 B2 | * | 4/2010 | Garcia et al. | 414/416.04 |
| 7,851,721 B2 | * | 12/2010 | Sze et al. | 209/573 |
| 2012/0285869 A1 | * | 11/2012 | Wang et al. | 209/575 |

* cited by examiner

*Primary Examiner* — Joseph C Rodriguez (74) *Attorney, Agent, or Firm* — Muncy, Geissler, Olds & Lowe, P.C.

(57) ABSTRACT

A packaged chip detection and classification device includes a rotation unit for transporting a plurality of packaged chips, a packaged chip detection unit, and a packaged chip classification unit. The rotation unit includes a rotary turntable, a plurality of receiving portions formed on the rotary turntable, and a plurality of suction-exhaust openings respectively formed in the receiving portions. Each receiving portion is used to selectively receive at least one of the packaged chips. The packaged chip detection unit includes a packaged chip detection module adjacent to the rotation unit for detecting each packaged chip. The packaged chip classification unit includes a packaged chip classification module adjacent to the rotation unit for classifying the packaged chips. Therefore, the packaged chip detection and classification device can be used to detect and classify no-lead packaged chips by matching the rotation unit, the packaged chip detection unit, and the packaged chip classification unit.

11 Claims, 6 Drawing Sheets

PACKAGED CHIP DETECTION AND CLASSIFICATION DEVICE

BACKGROUND OF THE INVENTION

1. Field of the Invention

The instant disclosure relates to a detection and classification device, and more particularly, to a packaged chip detection and classification device for detecting and classifying packaged chips.

2. Description of Related Art

In the semiconductor fabricating process, some small particles and defects are unavoidable. As the size of devices shrinks and the integration of circuits increases gradually, those small particles or defects affect the property of the integrated circuits more seriously. For improving the reliability of semiconductor devices, a plurality of tests are performed continuously to find the root cause of the defects or particles. Then, process parameters can be tuned correspondingly to reduce a presence of defects or particles so as to improve the yield and reliability of the semiconductor fabricating process.

In the prior art, a sampling is first performed to select a semiconductor wafer as a sample for following defect detection and analysis in advance. Then, a defect inspection is performed. Normally, a proper defect inspection machine is utilized to scan in a large scale to detect all defects on the semiconductor wafer. Since there are too many defects on a semiconductor wafer, a manual defect review with the SEM cannot be directly performed for all defects in practice. A manual defect classification is typically performed before the defect review. After separating the defects into different defect types, some defects are sampled for the defect review. Then, a defect root cause analysis may be performed in advance according to the result of the defect review to attempt to reduce the defect generation.

Thus, with the increasing variety and sophistication of electronic devices, the quality and the reliability of the electronic components are crucial to the performance of the electronic devices. Generally, it is necessary for the components to be tested when the manufacturing procedure is finished. In the traditional inspection method, all the components are disposed on a large-area disk and many cameras are used for capturing the images of the surface appearances of the components. For inspecting the bottom surface of each component, the large-area disk has to be transparent. One method is using a quartz glass as the large-area disk but quartz glass is an expensive material. In other words, the cost of the inspection system is extremely high. Another method is using a tempered glass as the disk. However, the hardness of the tempered glass is lower than that of the electronic components so that the surface of the tempered glass is easily scratched by the components. The scratches on the tempered glass surface influence the captured bottom surface image and the analysis for the bottom surface images will not be precise. On the other hand, there are cameras disposed on both sides of the disk (i.e., top side and bottom side) and the images may be not be in focus because of influence of light (i.e. glare or reflection) that passes though the large-area disk.

SUMMARY OF THE INVENTION

One particular aspect of the instant disclosure is to provide a packaged chip detection and classification device for detecting and classifying no-lead packaged chips such as QFN (Quad Flat No lead) chips.

One of the embodiments of the instant disclosure provides a packaged chip detection and classification device, comprising: a rotation unit for transporting a plurality of packaged chips, a packaged chip detection unit, and a packaged chip classification unit. The rotation unit includes at least one rotary turntable, a plurality of receiving portions formed on the at least one rotary turntable, and a plurality of suction-exhaust openings respectively formed in the receiving portions, wherein the receiving portions are surroundingly formed on the peripheral surface of the at least one rotary turntable, and each receiving portion is used to selectively receive at least one of the packaged chips. The packaged chip detection unit includes at least one packaged chip detection module adjacent to the rotation unit for detecting each packaged chip, wherein the at least one packaged chip detection module includes a plurality of detection pins electrically contacting each packaged chip to judge the packaged chip is a good packaged chip or a bad packaged chip and at least one movable nozzle for moving each packaged chip to electrically contact the detection pins. The packaged chip classification unit includes at least one packaged chip classification module adjacent to the rotation unit for classifying the packaged chips, wherein the at least one packaged chip classification module includes at least one first passing portion for receiving each good packaged chip and at least one second passing portion for receiving each bad packaged chip.

Moreover, the packaged chip detection and classification device further comprises a transportation unit including at least one transportation element adjacent to the rotation unit for sequentially transporting each packaged chip to the corresponding receiving portion. The packaged chip detection and classification device further comprises a packaged chip direction detecting unit adjacent to the transportation unit and the rotation unit, wherein the packaged chip direction detecting unit includes a reflecting mirror disposed under the packaged chip and an image capturing element disposed beside the reflecting mirror to capture the image of the packaged chip through the reflecting mirror. The packaged chip detection and classification device further comprises a packaged chip direction adjusting unit including a packaged chip direction adjusting nozzle adjacent to the packaged chip direction detecting unit to adjust the direction of the packaged chip. The packaged chip detection and classification device further comprises a bearing unit including at least one bearing base, wherein the at least one rotary turntable is disposed on the bearing base. The packaged chip detection and classification device further comprises a surface-detecting unit adjacent to the rotation unit and disposed between the at least one packaged chip detection module and the at least one packaged chip classification module, wherein the surface-detecting unit includes at least one top image capturing element disposed above the packaged chip and at least one bottom image capturing element disposed under the package chip.

One of the embodiments of the instant disclosure provides a packaged chip detection and classification device, comprising: a first rotation unit for transporting a plurality of packaged chips, a packaged chip detection unit, a second rotation unit, and a packaged chip classification unit. The first rotation unit includes at least one first rotary turntable, a plurality of first receiving portions formed on the first rotary turntable, and a plurality of first suction-exhaust openings respectively formed in the first receiving portions, wherein each first receiving portion is used to selectively receive at least one of the packaged chips. The packaged chip detection unit includes at least one packaged chip detection module adjacent to the first rotation unit for detecting each packaged chip. The second rotation unit is adjacent to the first rotation unit, wherein the second rotation unit includes at least one second rotary turntable, a plurality of second receiving portions formed on the second rotary turntable, and a plurality of second suction-exhaust openings respectively formed in the second receiving portions, wherein each second receiving portion is used to selectively receive at least one of the packaged chips conveyed from the first rotation unit. The packaged chip classification unit includes at least one packaged chip classification module adjacent to the second rotation unit for classifying the packaged chips.

Moreover, the packaged chip detection and classification device further comprises a transportation unit, a packaged chip direction detecting unit, and a packaged chip direction adjusting unit, wherein the transportation unit includes at least one transportation element adjacent to the first rotation unit for sequentially transporting each packaged chip to the corresponding receiving portion, wherein the packaged chip direction detecting unit is adjacent to the transportation unit and the first rotation unit, and the packaged chip direction detecting unit includes a reflecting mirror disposed under the packaged chip and an image capturing element disposed beside the reflecting mirror to capture the image of the packaged chip through the reflecting mirror, wherein the packaged chip direction adjusting unit includes a packaged chip direction adjusting nozzle adjacent to the packaged chip direction detecting unit to adjust the direction of the packaged chip. The packaged chip detection and classification device further comprises a bearing unit including at least one bearing base, wherein the first rotary turntable and the second rotary turntable are disposed on the bearing base. The packaged chip detection and classification device further comprises a surface-detecting unit adjacent to the second rotation unit and disposed between the at least one packaged chip detection module and the at least one packaged chip classification module, wherein the surface-detecting unit includes at least one top image capturing element disposed above the packaged chip and at least one bottom image capturing element disposed under the package chip.

One of the embodiments of the instant disclosure provides a packaged chip detection and classification device, comprising: a first rotation unit for transporting a plurality of packaged chips, a packaged chip detection unit, a second rotation unit, and a packaged chip classification unit. The first rotation unit includes at least one first rotary turntable, a plurality of first receiving portions formed on the first rotary turntable, and a plurality of first suction-exhaust openings respectively formed in the first receiving portions. The second rotation unit is adjacent to the first rotation unit, wherein the second rotation unit includes at least one second rotary turntable, a plurality of second receiving portions formed on the second rotary turntable, and a plurality of second suction-exhaust openings respectively formed in the second receiving portions. The packaged chip detection unit includes at least one packaged chip detection module adjacent to the first rotation unit for detecting each packaged chip. The packaged chip classification unit includes at least one packaged chip classification module adjacent to the second rotation unit for classifying the packaged chips.

Therefore, the packaged chip detection and classification device of the instant disclosure can be used to detect and classify no-lead packaged chips (such as QFN chips) by matching the rotation unit (or the first rotation unit and the second rotation unit), the packaged chip detection unit and the packaged chip classification unit.

To further understand the techniques, means and effects the instant disclosure takes for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention that they be used for limiting the instant disclosure.

DETAILED DESCRIPTION OF THE PREFERRED EMBODIMENTS

[First Embodiment]

Referring to FIGS. 1A to 1E, where the first embodiment of the instant disclosure provides a packaged chip detection and classification device, comprising: a first rotation unit 1 for transporting a plurality of packaged chips C, a packaged chip detection unit 2, a second rotation unit 3, and a packaged chip classification unit 4.

Figure 1A:
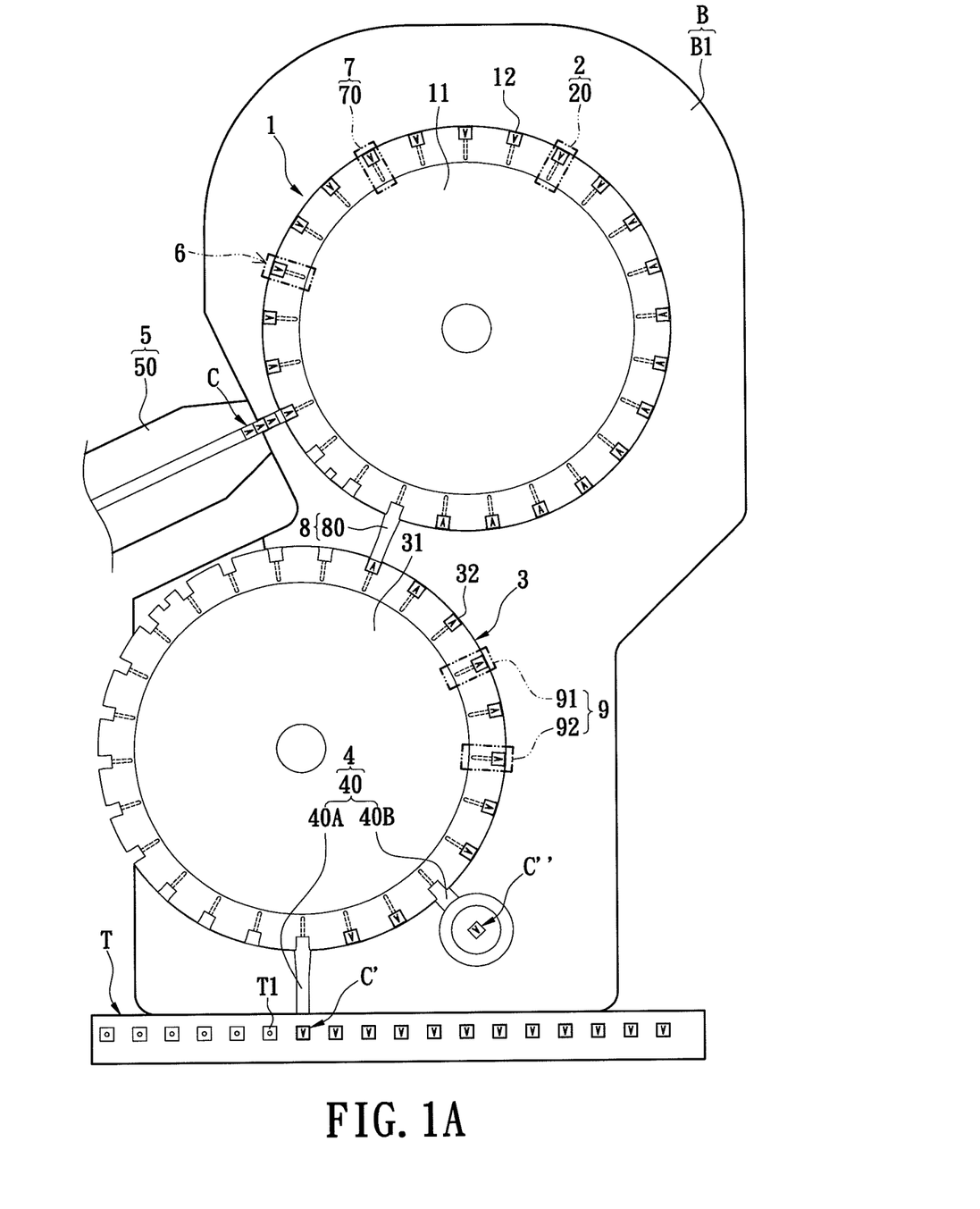
FIG. 1A shows a top, schematic view of the packaged chip detection and classification device according to the first embodiment of the instant disclosure.
Figure 1B:
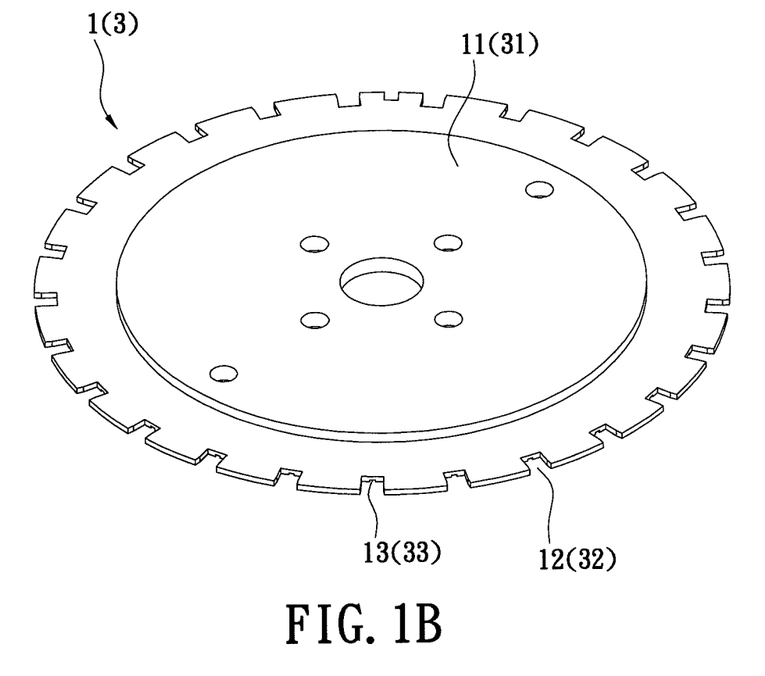
FIG. 1B shows a perspective, schematic view of the first rotation unit and the second rotation unit of the packaged chip detection and classification device according to the first embodiment of the instant disclosure.

Referring to FIGS. 1A and 1B, the first rotation unit 1 includes at least one first rotary turntable 11, a plurality of first receiving portions (accommodating spaces) 12 formed on the first rotary turntable 11, and a plurality of first suction-exhaust openings (dual-purpose opening for sucking or blowing packaged chip) 13 respectively formed in the first receiving portions 12. Each first receiving portion 12 is used to selectively receive at least one of the packaged chips C. For example, the first receiving portions 12 are surroundingly formed on the peripheral surface of the first rotary turntable 11 and each first receiving portion 12 has an outward opening, thus each packaged chip C can enter the first receiving portion 12 through the outward opening.

Figure 1C:
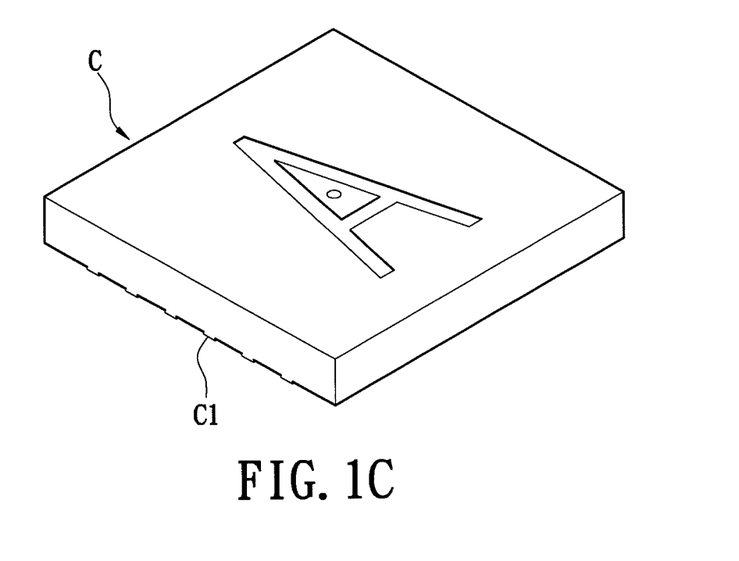
FIG. 1C shows a perspective, schematic view of the packaged chip applied to the packaged chip detection and classification device according to the first embodiment of the instant disclosure.
Figure 1D:
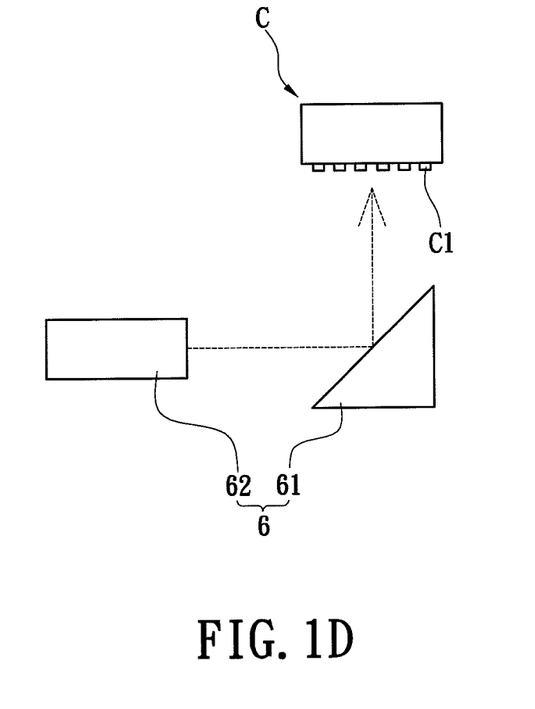
FIG. 1D shows a lateral, schematic view of the packaged chip direction detecting unit of the packaged chip detection and classification device according to the first embodiment of the instant disclosure.
Figure 1E:
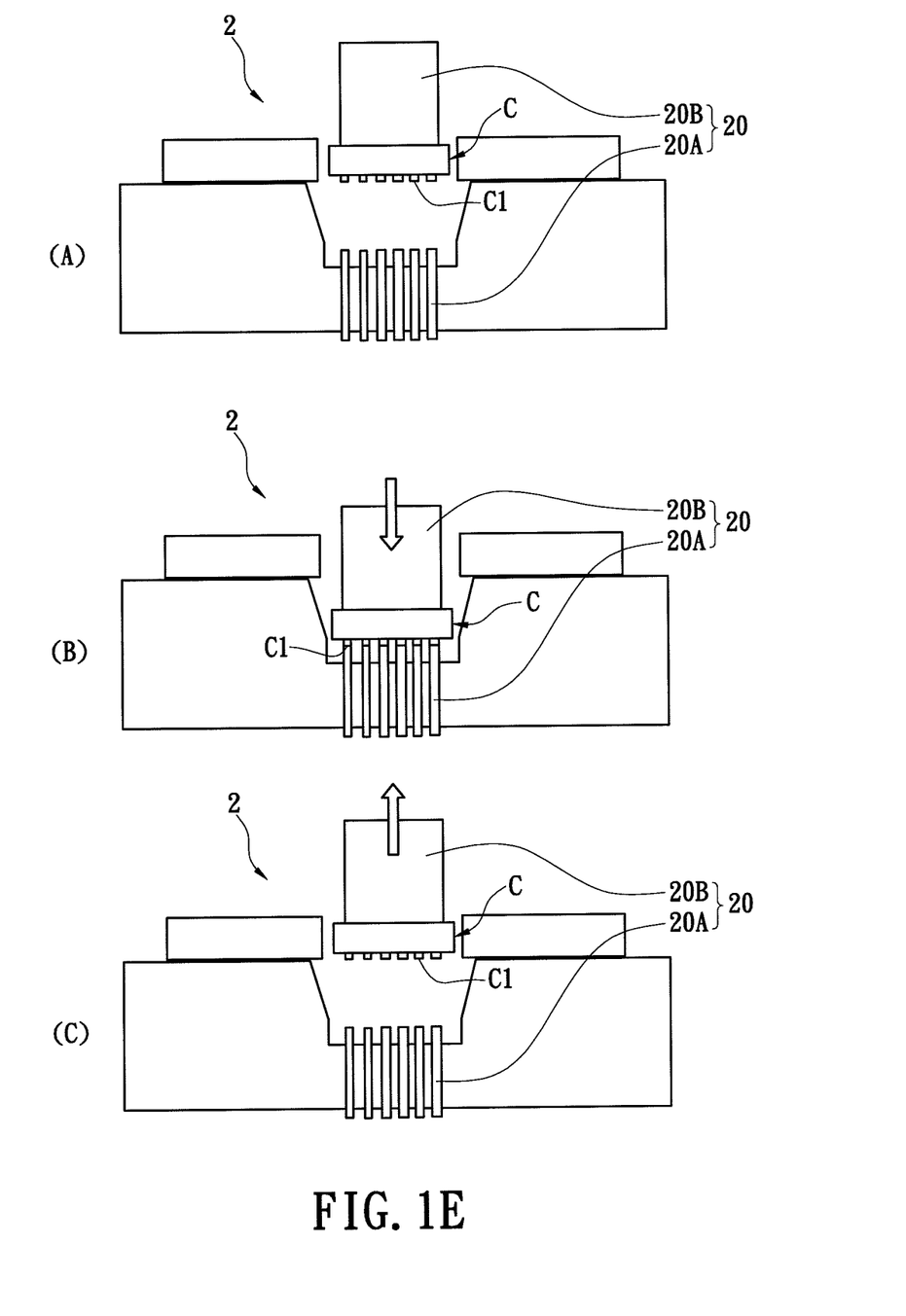
FIG. 1E shows three lateral, schematic views of the processes of detecting the packaged chip by packaged chip detection unit of the packaged chip detection and classification device according to the first embodiment of the instant disclosure, respectively.

Referring to FIGS. 1A, 1C and 1E, the packaged chip detection unit 2 includes at least one packaged chip detection module 20 adjacent to the first rotation unit 1 for detecting each packaged chip C. Of course, the instant disclosure can use a plurality of packaged chip detection module 20 at the same time according to different requirements. For example, referring to FIG. 1C, each packaged chip C may be a no-lead packaged chip (such as QFN chip), and each packaged chip C has a plurality of conductive pads C1. In addition, referring to FIG. 1E, the at least one packaged chip detection module 20 includes a plurality of detection pins 20A electrically contacting each packaged chip C to judge the packaged chip C is a good packaged chip C' or a bad packaged chip C" and at least one movable nozzle 20B for moving each packaged chip C to electrically contact the detection pins 20A. FIG. 1E (A) shows the at least one movable nozzle 20B sucks the packaged chip C. FIG. 1E (B) shows the packaged chip C is moved downwardly by the at least one movable nozzle 20B and the conductive pads C1 electrically contact the detection pins 20A to judge whether the packaged chip C is good. FIG. 1E (C) shows the packaged chip C is moved upwardly to the initial position as shown in FIG. 1E (A) by the at least one movable nozzle 20B.

Referring to FIGS. 1A and 1B, the shape of the second rotation unit 3 is the same as that of the first rotation unit 1, and the second rotation unit 3 is adjacent to the first rotation unit 1. The second rotation unit 3 includes at least one second rotary turntable 31, a plurality of second receiving portions (accommodating spaces) 32 formed on the second rotary turntable 31, and a plurality of second suction-exhaust openings (dual-purpose opening for sucking or blowing packaged chip) 33 respectively formed in the second receiving portions 32. Each second receiving portion 32 is used to selectively receive at least one of the packaged chips C conveyed from the first rotation unit 1. For example, the second receiving portions 32 are surroundingly formed on the peripheral surface of the second rotary turntable 31 and each second receiving portion 32 has an outward opening, thus each packaged chip C can enter the second receiving portion 32 through the outward opening.

Referring to FIG. 1A, the packaged chip classification unit 4 includes at least one packaged chip classification module 40 adjacent to the second rotation unit 3 for classifying the packaged chips C. For example, the at least one packaged chip classification module 40 includes at least one first passing portion (passing passage) 40A for receiving each good packaged chip C' and at least one second passing portion 40B for receiving each bad packaged chip C". In general, when each good packaged chip C' passes through the at least one first passing portion 40A, each good packaged chip C' can be embedded into the package groove T1 of the rolling tape T. When each bad packaged chip C" passes through the at least one second passing portion 40B, each bad packaged chip C" is collected in the same vessel.

Referring to FIGS. 1A and 1D, the first embodiment of the instant disclosure further comprises a transportation unit 5, a packaged chip direction detecting unit 6, and a packaged chip direction adjusting unit 7. The transportation unit 5 includes at least one transportation element 50 adjacent to the first rotation unit 1 for sequentially transporting each packaged chip C to the corresponding receiving portion 12. The packaged chip direction detecting unit 6 is adjacent to the transportation unit 5 and the first rotation unit 1, and the packaged chip direction detecting unit 6 includes a reflecting mirror 61 disposed under the packaged chip C and an image capturing element 62 disposed beside the reflecting mirror 61 to capture the image of the packaged chip C through the reflecting mirror 61. The packaged chip direction adjusting unit 7 includes a packaged chip direction adjusting nozzle 70 adjacent to the packaged chip direction detecting unit 6 to adjust the direction of the packaged chip C. In other words, when the wrong arrangement direction of the packaged chip C is detected by the packaged chip direction detecting unit 6, the arrangement direction of the packaged chip C can be adjusted by the packaged chip direction adjusting unit 7

Referring to FIG. 1A, the first embodiment of the instant disclosure further comprises a bridge connection unit 8 including at least one bridge connection element 80 disposed between the first rotation unit 1 and the second rotation unit 3. When the packaged chip C has been detected by the at least one packaged chip detection module 20, the packaged chip C can be transported from the first receiving portion 12 of the first rotation unit 1 to the second receiving portion 32 of the second rotation unit 3 to execute classification by the at least one packaged chip classification module 40.

Referring to FIG. 1A, the first embodiment of the instant disclosure further comprises a surface-detecting unit 9 adjacent to the second rotation unit 3 and disposed between the at least one packaged chip detection module 20 and the at least one packaged chip classification module 40. The surface-detecting unit 9 includes at least one top image capturing element 91 disposed above the packaged chip C and at least one bottom image capturing element 92 disposed under the package chip C. In other words, the top surface image of the packaged chip C can be captured by the at least one top image capturing element 91 (such as a digital camera), and the bottom surface image of the packaged chip C can be captured by the at least one bottom image capturing element 92. Hence, the packaged chip C with good top and bottom surface images can be sifted out by matching the at least one top image capturing element 91 and the at least one bottom image capturing element 92.

Referring to FIG. 1A, the first embodiment of the instant disclosure further comprises a bearing unit B including at least one bearing base B1, and the first rotary turntable 11 and the second rotary turntable 31 are disposed on the bearing base B1. Of course, the bearing base B1 can be divided into two separated bases (not shown), and the first rotary turntable 11 and the second rotary turntable 31 can be respectively disposed on the two separated bases.

In other words, the first embodiment of the instant disclosure provides a packaged chip detection and classification device, at least comprising: a first rotation unit 1 for transporting a plurality of packaged chips C, a packaged chip detection unit 2, a second rotation unit 3, and a packaged chip classification unit 4. The first rotation unit 1 includes at least one first rotary turntable 11, a plurality of first receiving portions 12 formed on the first rotary turntable 11, and a plurality of first suction-exhaust openings 13 respectively formed in the first receiving portions 12. Each first receiving portion 12 is used to selectively receive at least one of the packaged chips C. The packaged chip detection unit 2 includes at least one packaged chip detection module 20 adjacent to the first rotation unit 1 for detecting each packaged chip C. The second rotation unit 3 is adjacent to the first rotation unit 1. The second rotation unit 3 includes at least one second rotary turntable 31, a plurality of second receiving portions 32 formed on the second rotary turntable 31, and a plurality of second suction-exhaust openings 33 respectively formed in the second receiving portions 32. Each second receiving portion 32 is used to selectively receive at least one of the packaged chips C conveyed from the first rotation unit 1. The packaged chip classification unit 4 includes at least one packaged chip classification module 40 adjacent to the second rotation unit 3 for classifying the packaged chips C.

[Second Embodiment]

Figure 2A:
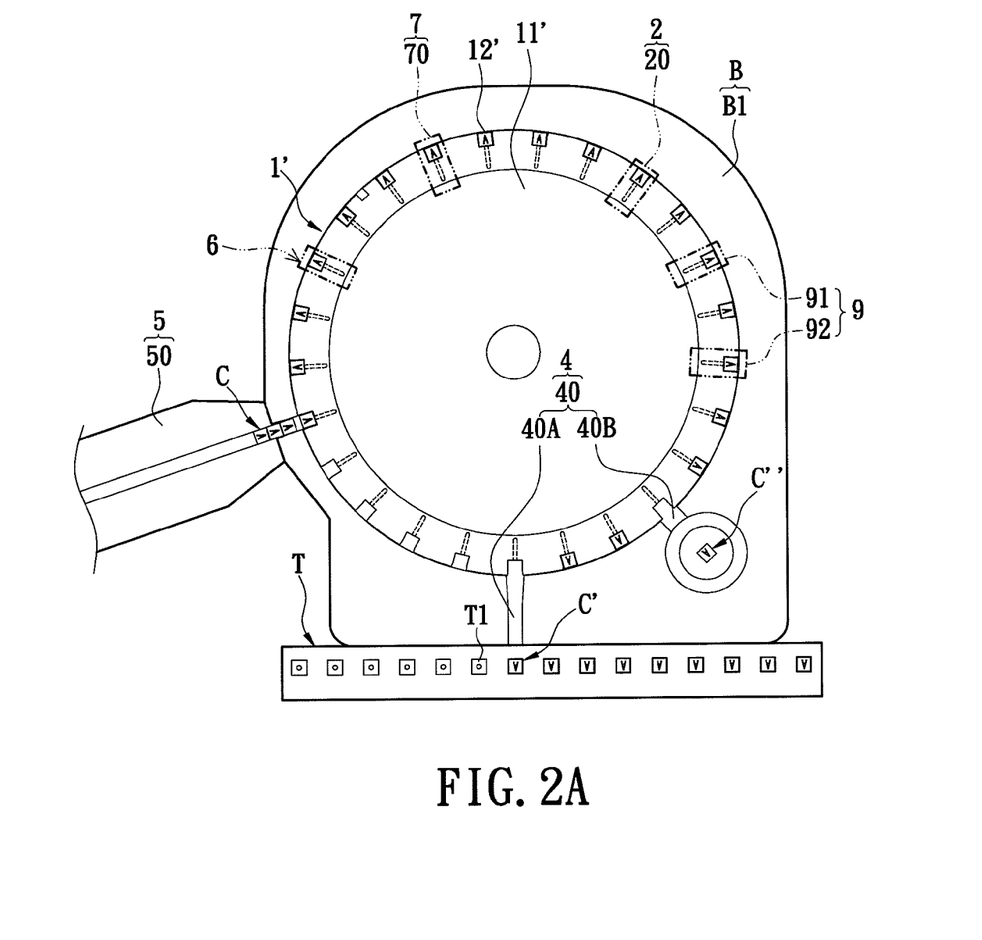
FIG. 2A shows a top, schematic view of the packaged chip detection and classification device according to the second embodiment of the instant disclosure.
Figure 2B:
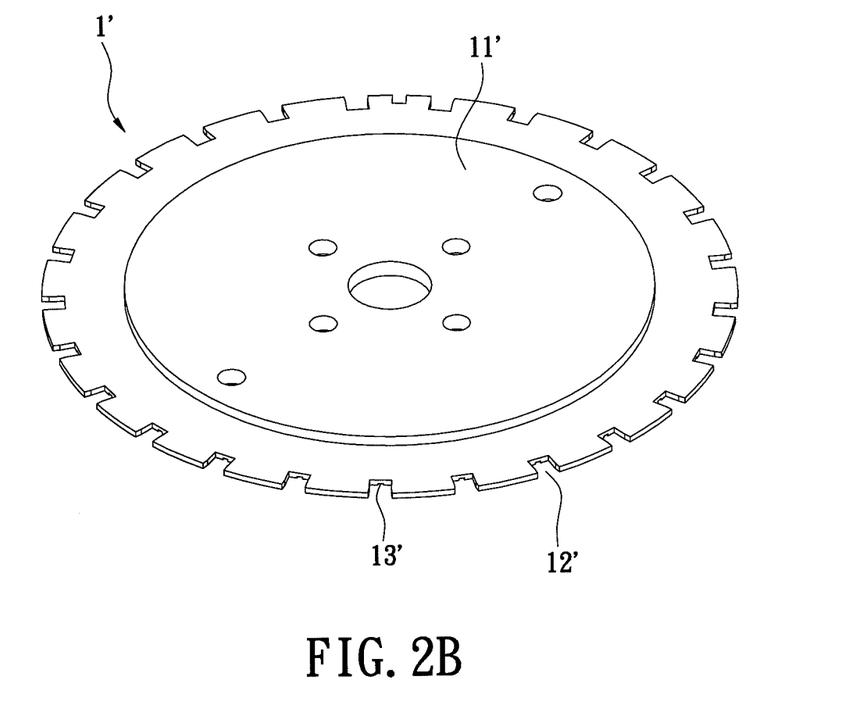
FIG. 2B shows a perspective, schematic view of the rotation unit of the packaged chip detection and classification device according to the second embodiment of the instant disclosure.

Referring to FIGS. 2A to 2B, where the second embodiment of the instant disclosure provides a packaged chip detection and classification device, comprising: a rotation unit 1' for transporting a plurality of packaged chips C, a packaged chip detection unit 2, a packaged chip classification unit 4, a transportation unit 5, a packaged chip direction detecting unit 6, a packaged chip direction adjusting unit 7, and a surface-detecting unit 9. Comparing FIG. 2A with FIG. 1A and FIG. 2B with FIG. 1B, the difference between the second embodiment and the first embodiment is that: the second embodiment omits the second rotation unit 3 of the first embodiment.

In the second embodiment, the rotation unit 1' includes at least one rotary turntable 11', a plurality of receiving portions (accommodating spaces) 12' formed on the at least one rotary turntable 11', and a plurality of suction-exhaust openings (dual-purpose opening for sucking or blowing packaged chip) 13' respectively formed in the receiving portions 12'. Each receiving portion 12' is used to selectively receive at least one of the packaged chips C. For example, the receiving portions 12' are surroundingly formed on the peripheral surface of the at least one rotary turntable 11' and each receiving portion 12' has an outward opening, thus each packaged chip C can enter the receiving portion 12' through the outward opening.

In the second embodiment, the packaged chip detection unit 2 includes at least one packaged chip detection module 20 adjacent to the rotation unit 1' for detecting each packaged chip C. For example, each packaged chip C may be a no-lead packaged chip (such as QFN chip), and each packaged chip C has a plurality of conductive pads (not shown). In addition, the at least one packaged chip detection module 20 includes a plurality of detection pins (not shown) electrically contacting each packaged chip C to judge the packaged chip C is a good packaged chip C' or a bad packaged chip C" and at least one movable nozzle (not shown) for moving each packaged chip C to electrically contact the detection pins.

In the second embodiment, the packaged chip classification unit 4 includes at least one packaged chip classification module 40 adjacent to the rotation unit 1' for classifying the packaged chips C. For example, the at least one packaged chip classification module 40 includes at least one first passing portion (passing passage) 40A for receiving each good packaged chip C' and at least one second passing portion 40B for receiving each bad packaged chip C". In general, when each good packaged chip C' passes through the at least one first passing portion 40A, each good packaged chip C' can be embedded into the package groove T1 of the rolling tape T. When each bad packaged chip C" passes through the at least one second passing portion 40B, each bad packaged chip C" is collected in the same vessel.

In the second embodiment, the transportation unit 5 includes at least one transportation element 50 adjacent to the rotation unit 1' for sequentially transporting each packaged chip C to the corresponding receiving portion 12'. The packaged chip direction detecting unit 6 is adjacent to the transportation unit 5 and the rotation unit 1'. The packaged chip direction adjusting unit 7 includes a packaged chip direction adjusting nozzle 70 adjacent to the packaged chip direction detecting unit 6 to adjust the direction of the packaged chip C. The surface-detecting unit 9 is adjacent to the rotation unit 1' and disposed between the at least one packaged chip detection module 20 and the at least one packaged chip classification module 40. The surface-detecting unit 9 includes at least one top image capturing element 91 disposed above the packaged chip C and at least one bottom image capturing element 92 disposed under the package chip C.

The second embodiment of the instant disclosure further comprises a bearing unit B including at least one bearing base B1, and the at least one rotary turntable 11' is disposed on the bearing base B1.

In conclusion, the packaged chip detection and classification device of the instant disclosure can be used to detect and classify no-lead packaged chips (such as QFN chips) by matching the rotation unit (or the first rotation unit and the second rotation unit), the packaged chip detection unit and the packaged chip classification unit.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. A packaged chip detection and classification device, comprising:
    a first rotation unit for transporting a plurality of packaged chips, including at least one first rotary turntable, a plurality of first receiving portions formed on the first rotary turntable, and a plurality of first suction-exhaust openings respectively formed in the first receiving portions, wherein each first receiving portion is used to selectively receive at least one of the packaged chips;
    a packaged chip detection unit including at least one packaged chip detection module adjacent to the first rotation unit for detecting each packaged chip;
    a second rotation unit adjacent to the first rotation unit, wherein the second rotation unit includes at least one second rotary turntable, a plurality of second receiving portions formed on the second rotary turntable, and a plurality of second suction-exhaust openings respectively formed in the second receiving portions, wherein each second receiving portion is used to selectively receive at least one of the packaged chips conveyed from the first rotation unit; and
    a packaged chip classification unit including at least one packaged chip classification module adjacent to the second rotation unit for classifying the packaged chips.

2. The packaged chip detection and classification device of claim 1, further comprising: a transportation unit, a packaged chip direction detecting unit, and a packaged chip direction adjusting unit, wherein the transportation unit includes at least one transportation element adjacent to the first rotation unit for sequentially transporting each packaged chip to the corresponding receiving portion, wherein the packaged chip direction detecting unit is adjacent to the transportation unit and the first rotation unit, and the packaged chip direction detecting unit includes a reflecting mirror disposed under the packaged chip and an image capturing element disposed beside the reflecting mirror to capture the image of the packaged chip through the reflecting mirror, wherein the packaged chip direction adjusting unit includes a packaged chip direction adjusting nozzle adjacent to the packaged chip direction detecting unit to adjust the direction of the packaged chip.

3. The packaged chip detection and classification device of claim 1, further comprising: a bearing unit including at least one bearing base, wherein the first rotary turntable and the second rotary turntable are disposed on the bearing base.

4. The packaged chip detection and classification device of claim 1, wherein the first receiving portions are surroundingly formed on the peripheral surface of the first rotary turntable, and the second receiving portions are surroundingly formed on the peripheral surface of the second rotary turntable.

5. The packaged chip detection and classification device of claim 1, wherein the at least one packaged chip detection module includes a plurality of detection pins electrically contacting each packaged chip to judge the packaged chip is a good packaged chip or a bad packaged chip and at least one movable nozzle for moving each packaged chip to electrically contact the detection pins, and the at least one packaged chip classification module includes at least one first passing portion for receiving each good packaged chip and at least one second passing portion for receiving each bad packaged chip.

6. The packaged chip detection and classification device of claim 1, further comprising: a surface-detecting unit adjacent to the second rotation unit and disposed between the at least one packaged chip detection module and the at least one packaged chip classification module, wherein the surface-detecting unit includes at least one top image capturing element disposed above the packaged chip and at least one bottom image capturing element disposed under the package chip.

7. A packaged chip detection and classification device, comprising:
- a first rotation unit including at least one first rotary turntable, a plurality of first receiving portions formed on the first rotary turntable, and a plurality of first suction-exhaust openings respectively formed in the first receiving portions;
- a second rotation unit adjacent to the first rotation unit, wherein the second rotation unit includes at least one second rotary turntable, a plurality of second receiving portions formed on the second rotary turntable, and a plurality of second suction-exhaust openings respectively formed in the second receiving portions;
- a packaged chip detection unit including at least one packaged chip detection module adjacent to the first rotation unit for detecting each packaged chip; and
- a packaged chip classification unit including at least one packaged chip classification module adjacent to the second rotation unit for classifying the packaged chips.

8. The packaged chip detection and classification device of claim 7, further comprising: a transportation unit, a packaged chip direction detecting unit, and a packaged chip direction adjusting unit, wherein the transportation unit includes at least one transportation element adjacent to the first rotation unit for sequentially transporting each packaged chip to the corresponding receiving portion, wherein the packaged chip direction detecting unit is adjacent to the transportation unit and the first rotation unit, and the packaged chip direction detecting unit includes a reflecting mirror disposed under the packaged chip and an image capturing element disposed beside the reflecting mirror to capture the image of the packaged chip through the reflecting mirror, wherein the packaged chip direction adjusting unit includes a packaged chip direction adjusting nozzle adjacent to the packaged chip direction detecting unit to adjust the direction of the packaged chip.

9. The packaged chip detection and classification device of claim 7, further comprising: a bearing unit including at least one bearing base, wherein the first rotary turntable and the second rotary turntable are disposed on the bearing base, wherein the first receiving portions are surroundingly formed on the peripheral surface of the first rotary turntable, and the second receiving portions are surroundingly formed on the peripheral surface of the second rotary turntable.

10. The packaged chip detection and classification device of claim 7, wherein the at least one packaged chip detection module includes a plurality of detection pins electrically contacting each packaged chip to judge the packaged chip is a good packaged chip or a bad packaged chip and at least one movable nozzle for moving each packaged chip to electrically contact the detection pins, and the at least one packaged chip classification module includes at least one first passing portion for receiving each good packaged chip and at least one second passing portion for receiving each bad packaged chip.

11. The packaged chip detection and classification device of claim 7, further comprising: a surface-detecting unit adjacent to the second rotation unit and disposed between the at least one packaged chip detection module and the at least one packaged chip classification module, wherein the surface-detecting unit includes at least one top image capturing element disposed above the packaged chip and at least one bottom image capturing element disposed under the package chip.

* * * * *